US012745662B2

(12) United States Patent
Ishibe et al.

(10) Patent No.: US 12,745,662 B2
(45) Date of Patent: Sep. 22, 2026

(54) MOLDED THIN SEMICONDUCTOR DIE PACKAGES AND RELATED METHODS

(71) Applicant: SEMICONDUCTOR COMPONENTS INDUSTRIES, LLC, Phoenix, AZ (US)

(72) Inventors: Shinzo Ishibe, Oizumi-machi (JP); Takashi Noma, Ota (JP)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 744 days.

(21) Appl. No.: 18/175,079

(22) Filed: Feb. 27, 2023

(65) Prior Publication Data

US 2024/0290736 A1 Aug. 29, 2024

(51) Int. Cl.
*H10W 72/00* (2026.01)
*H10W 72/90* (2026.01)

(52) U.S. Cl.
CPC ......... *H10W 72/019* (2026.01); *H10W 72/90* (2026.01); *H10W 72/01908* (2026.01);
(Continued)

(58) Field of Classification Search
CPC ..... H01L 24/02–09; H01L 2224/04042; H01L 2224/02125; H01L 2224/08111; H01L 2224/08112; H01L 2224/05147; H01L 2224/08145–08148; H01L 21/565–566; H01L 21/02422; H10W 74/016–017; H10W 72/019; H10W 72/90; H10W 72/00; H10W 72/983; H10W 72/59; H10W 72/9415; H10W 80/743; H10W 90/792; H10W 20/068; H10W 20/069; H10W 20/082; H10W 20/083; H10W 20/089; H10W 20/056; H10W 20/42;
(Continued)

(56) References Cited

U.S. PATENT DOCUMENTS 8,590,145 B2 11/2013 Eichelberger et al.
8,952,545 B2 2/2015 Otremba et al.
(Continued)

OTHER PUBLICATIONS

German Search Report, DE102024101158.0, German Patent Office, Sep. 13, 2024, 18 pages.

*Primary Examiner* — Wael M Fahmy
*Assistant Examiner* — Thomas Wilson McCoy
(74) *Attorney, Agent, or Firm* — IPTechLaw

(57) ABSTRACT

Implementations of a method of forming an over pad metallization structure may include providing a semiconductor substrate including a plurality of copper pads on a first side of the semiconductor substrate; electroless plating an over pad metallization including nickel, palladium, and gold onto each copper pad of the plurality of copper pads; and patterning a layer of photoresist onto the over pad metallization of each copper pad of the plurality of copper pads. The method may include forming a mold compound over the plurality of copper pads, the over pad metallization, and the layer of photoresist of each copper pad; removing a portion of the mold compound and a portion of the layer of photoresist of each copper pad of the plurality of copper pads; and removing the layer of photoresist to expose the over pad metallization of each copper pad of the plurality of copper pads.

20 Claims, 5 Drawing Sheets

(52) U.S. Cl.
CPC .... *H10W 72/01935* (2026.01); *H10W 72/923* (2026.01); *H10W 72/952* (2026.01); *H10W 72/981* (2026.01)

(58) Field of Classification Search
CPC . H10W 20/435; H10W 20/427; H10W 20/43; H10W 20/20; H10W 70/60; H10W 70/611; H10W 70/635; H10W 70/65; H10W 70/09; H10D 84/0149; H10D 84/038; H10D 84/0186
See application file for complete search history.

(56) References Cited

U.S. PATENT DOCUMENTS 11,266,022 B2* 3/2022 Klocek .................... C23F 1/16
2006/0049514 A1 3/2006 Sven et al.
2012/0248639 A1* 10/2012 Akagawa ........... B29C 45/0001 525/123
2013/0320454 A1 12/2013 Kazutaka et al.
2014/0131848 A1* 5/2014 Lee .................... H01L 21/4828 257/676
2014/0147970 A1* 5/2014 Kim ........................ H01L 25/50 438/107
2014/0369573 A1* 12/2014 Chiu ................. G06V 40/1306 382/124
2015/0108424 A1* 4/2015 Huang ................ H10H 20/831 257/13
2019/0006339 A1* 1/2019 Lau .................... H01L 23/3675
2019/0148306 A1* 5/2019 Lin ........................ H01L 24/05 438/530
2019/0189584 A1* 6/2019 Kawashiro ........... H01L 25/072
2021/0028098 A1 1/2021 Yoo et al.
2021/0057347 A1 2/2021 Liu et al.
2021/0242083 A1 8/2021 Hsieh et al.
2021/0343540 A1 11/2021 Carney et al.
2021/0375765 A1 12/2021 Tseng et al.
2023/0253339 A1* 8/2023 McLaren ............... H01L 23/66 257/659

* cited by examiner

MOLDED THIN SEMICONDUCTOR DIE PACKAGES AND RELATED METHODS

BACKGROUND

1. Technical Field

Aspects of this document relate generally to semiconductor devices. More specific implementations involve methods for packaging semiconductor devices that include thin semiconductor die.

2. Background

Semiconductor packages have been devised that work to provide mechanical support and electrical connections for semiconductor die to a socket or motherboard to which the semiconductor package is attached. Various semiconductor packages also have been developed that provide protection from humidity or electrostatic discharge for the various semiconductor die and components included in the package.

SUMMARY

Implementations of a method of forming an over pad metallization structure may include providing a semiconductor substrate including a plurality of copper pads on a first side of the semiconductor substrate; electroless plating an over pad metallization including nickel, palladium, and gold onto each copper pad of the plurality of copper pads; and patterning a layer of photoresist onto the over pad metallization of each copper pad of the plurality of copper pads. The method may include forming a mold compound over the plurality of copper pads, the over pad metallization of each copper pad, and the layer of photoresist of each copper pad; removing a portion of the mold compound and a portion of the layer of photoresist of each copper pad of the plurality of copper pads; and removing the layer of photoresist to expose the over pad metallization of each copper pad of the plurality of copper pads.

Implementations of methods of forming an over pad metallization structure may include one, all, or any of the following:

Removing the portion of the mold compound and the portion of the layer of photoresist further may include backgrinding.

The mold compound may include 90% glass filler.

The over pad metallization may consist of nickel, palladium, and gold.

Patterning the layer of photoresist further may include one of applying the photoresist, exposing the photoresist on the plurality of copper pads to electromagnetic radiation, and removing unexposed photoresist; or applying the photoresist, exposing the photoresist not on the plurality of copper pads to electromagnetic radiation, and removing exposed photoresist.

The method may include, after removing the layer of photoresist to expose the over pad metallization, thinning the semiconductor substrate to a thickness of 25 microns or less from a second side of the semiconductor substrate opposite the first side.

The method may include forming a back metal layer on the second side of the semiconductor substrate, the back metal layer including a layer of copper and a layer including nickel, palladium, and gold.

Implementations of a method of forming an over pad metallization structure may include providing a semiconductor substrate including a plurality of copper pads on a first side of the semiconductor substrate; electroless plating an over pad metallization including nickel, palladium, and gold onto each copper pad of the plurality of copper pads; and electroplating a layer of copper onto the over pad metallization of each copper pad of the plurality of copper pads. The method may include forming a mold compound over the plurality of copper pads, the over pad metallization of each copper pad, and the layer of copper of each copper pad; removing a portion of the mold compound and a portion of the layer of copper of each copper pad of the plurality of copper pads; and removing the layer of copper of each copper pad to expose the over pad metallization of each copper pad of the plurality of copper pads.

Implementations of a method of forming an over pad metallization structure may include one, all, or any of the following:

Removing the portion of the mold compound and the portion of the layer of copper further may include backgrinding.

The mold compound may include 90% glass filler.

The over pad metallization consists of nickel, palladium, and gold.

The method may include, after removing the layer of copper to expose the over pad metallization, thinning the semiconductor substrate to a thickness of 25 microns or less from a second side of the semiconductor substrate opposite the first side.

The method may include forming a back metal layer on the second side of the semiconductor substrate, where the back metal layer includes a layer of copper and a layer including nickel, palladium, and gold.

Removing the layer of copper further may include removing by etching the layer of copper.

Implementations of a method of forming an over pad metallization structure may include providing a semiconductor substrate including a plurality of copper pads on a first side of the semiconductor substrate; electroless plating an over pad metallization including nickel, palladium, and gold onto each copper pad of the plurality of copper pads; and forming a mold compound over the plurality of copper pads, the over pad metallization of each copper pad, and a layer of photoresist of each copper pad. The method may include only after electroless plating of the over pad metallization, removing a portion of the mold compound using grinding.

Implementations of a method of forming an over pad metallization structure may include one, all, or any of the following:

The method may include patterning a layer of photoresist onto the over pad metallization of each copper pad of the plurality of copper pads; and where removing a portion of the mold compound using grinding further may include removing a portion of the layer of photoresist.

The method may include removing the layer of photoresist to expose the over pad metallization of each copper pad of the plurality of copper pads.

The method may include electroplating a layer of copper onto the over pad metallization of each copper pad of the plurality of copper pads where removing a portion of the mold compound using grinding further may include removing a portion of the layer of copper.

The method may include removing the layer of copper to expose the over pad metallization of each copper pad of the plurality of copper pads.

Removing the layer of copper further may include etching.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended molded thin semiconductor die packages will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such molded thin semiconductor die, and implementing components and methods, consistent with the intended operation and methods.

Figure 1:
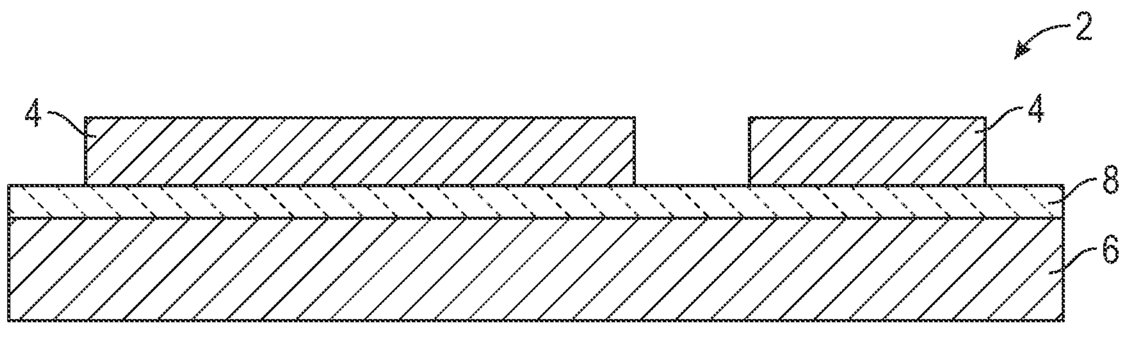
FIG. 1 is a side view of an implementation of a semiconductor substrate following formation of a plurality of copper pads thereon.

Referring to FIG. 1, a side view of implementation of a semiconductor substrate 2 is illustrated that includes copper pads 4 thereon. While this is a side view, it also may be considered to be a cross sectional view showing the layers like other side views in this document. Here the semiconductor substrate 2 includes a layer 6 of silicon, but any of a wide variety of other semiconductor materials could be used in various implementations, including, by non-limiting example, silicon carbide, silicon-on-insulator, gallium arsenide, sapphire, ruby, gallium arsenide, germanium or any other type of semiconductor material. Here, initial processing of the semiconductor substrate has formed a plurality of active devices in/on the layer 6 of silicon (not shown for easier illustration) and a passivation layer of silicon dioxide 8 has been formed on the layer 6. While silicon dioxide is illustrated in the implementation in FIG. 1, other passivating materials like silicon nitride could also be used in other implementations. In various implementations, openings in the passivation layer may be formed to allow for electrical connections to various pads (not shown in FIG. 1 for easier illustration) under each of the copper pads 4.

Prior to the formation of the copper pads 4, a under bump metal (UBM) layer is applied over the passivation layer 8 which may be formed using, by non-limiting example, sputtering, chemical vapor deposition (CVD), electroplating, electroless plating or any other method for forming a layer of the particular material of the UBM. A wide variety of under bump materials may be used singly or in combination, such as, by non-limiting example, nickel, palladium, platinum, gold, silver, aluminum, any combination thereof, or any other UBM material type. Following formation of the UBM layer, a lithographic process is employed to form openings in the photoresist for the copper pads 4 to be electroplated. The thickness of the photoresist layer is determined by the ultimate thickness of the copper pads/bumps desired. In various implementations, the thickness of the copper pads 4 may be between about 25 microns to about 50 microns though the pads could be thicker or thinner in various implementations. Following electroplating the copper pads/bumps, the photoresist is stripped/removed and an etching process is used to remove the UBM layer from between the copper pads 4 to prevent the UBM material from electrically shorting the various copper pads 4 together. While in the implementation in FIG. 1 just two copper pads 4 are illustrated on the semiconductor substrate 2, this is only for the purposes of convenient illustration as the semiconductor substrate 2 can be much larger that illustrated and contain many more copper pads thereon.

With the copper pads 4 formed, in one implementation of forming a semiconductor package with an over pad metallization, a mold compound is then applied over the copper pads 4 which entirely covers each of the copper pads 4. The mold compound over the copper pads is then ground off along with a portion of the copper pads. Where the initial as-plated thickness of the copper pads is 50 microns, following the grinding process, the remaining thickness of the copper pads may be 25 microns. One of the challenges of performing the grinding operation is that the resulting surface of the ground copper pads may be quite rough depending on whether the grinding wheel is designed for bulk (more rapid) removal or fine (slower) removal. In various implementations, the use of fine grinding of the mold compound plus copper pads may result in a high wear rate of the grinding wheel which can increase the cost of the process. Thus, the use of grinding wheels capable of doing bulk removal leaving higher roughness may be needed for economic reasons. Where the features of the copper pads are sufficiently close, the grinding wheel can drag copper into the grinding marks between copper pads, leading to bridging by subsequent electroless over pad metallization processes. Where the mold compound is a resin that has a high amount of glass filler, such as 90% glass filler, the ability to successfully remove the mold compound using an etching process may be very difficult. Also, because the over pad metallization is electroless plated over the copper pads, the roughness of the copper pads translates into a corresponding roughness in the over pad metallization.

Various methods of forming an over pad metallization over a copper pad are disclosed in this document that involve forming the over pad metallization prior to any grinding process. These methods result in over pad metallizations that can be applied to fine features without the challenges of bridging or roughness of the resulting over pad metallization material.

Figure 2:
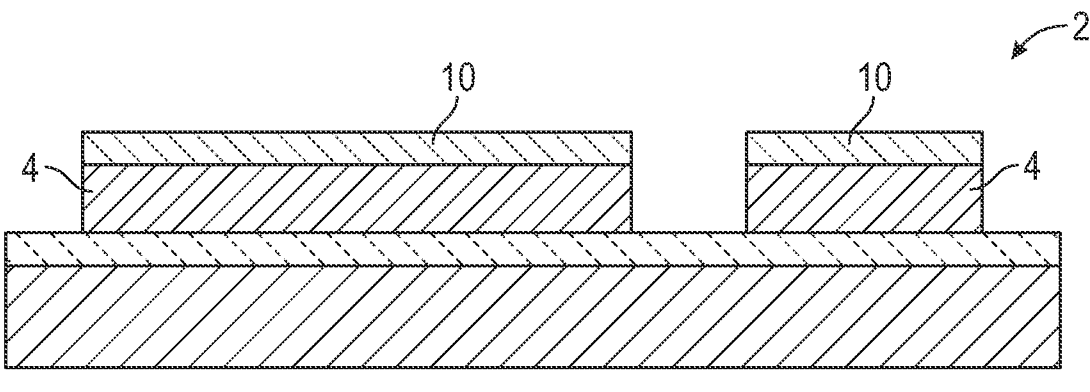
FIG. 2 is a side view of the semiconductor substrate of FIG. 1 following electroless plating of a layer of an over pad metallization.

Referring to FIG. 2, the semiconductor substrate 2 implementation of FIG. 1 is illustrated following electroless deposition of a layer of over pad metallization 10 over the copper pads 4. Because the copper pads are not ground during the method implementations disclosed herein, the plated height/thickness of the copper pads may be less than the plated height/thickness of copper pads used in the previously described process. By non-limiting example, the thickness of the copper pads in FIGS. 1-2 may be about 25 microns, or about the final thickness of the ground copper pads previously disclosed. The ability to use thinner pads may result in cost savings and corresponding throughput improvements because the copper pad formation process does not need to take place for as long to reach a 50 micron thickness. Also, the roughness of the over pad metallization formed on the as-plated surfaces of the copper pads may substantially match the roughness of the as-plated surfaces. Various over pad metallizations that can be electroless plated onto copper may be employed in various method implementations. In a particular implementation, the over pad metallization may include only nickel, palladium, and gold. In other implementations, additional elements or fewer elements may be included in the over pad metallization. The over pad metallization may be formed using electroless plating of each element as a separate layer, e.g., a layer of nickel, a layer of palladium, and a layer of gold, or the elements may be electroless plated as one layer or two layers in various combinations of elements though the over pad metallization illustrated in the figures shows just one layer. In a particular implementation, the thickness of the over pad metallization layer is 1.25 microns though layers of less or greater thickness may be used in other implementations.

Figure 3:
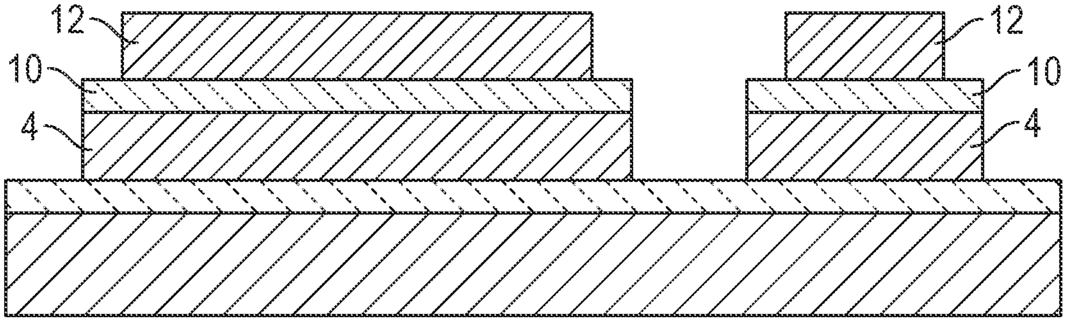
FIG. 3 is a side view of the semiconductor substrate of FIG. 2 with a patterned photoresist layer on the over pad metallization.

Following formation of the over pad metallization, referring to FIG. 3, the semiconductor substrate 2 is illustrated following patterning of a photoresist layer 12 on each of the over pad metallization layers 10 on each of the copper pads 4. In various method implementations, the photoresist pattern may be formed using various lithographic techniques. Where the photoresist is a positive photoresist, the layer of photoresist may be applied over the copper pads 4 using various coating techniques, such as, by non-limiting example, spin coating, dispensing, screen printing, stenciling, or any other technique for forming a layer of photoresist over the copper pads. The area surrounding the photoresist is then exposed, using a mask, to electromagnetic radiation, such as, by non-limiting example, visible light, ultraviolet light, x-rays, or any other radiation type capable of sensitizing the material of the photoresist. The exposed photoresist is then removed via a developing process leaving the unexposed photo resist as the patterned photoresist layer 12. For a negative photoresist the process is similar except that the photoresist material above the copper pads is what is exposed using the mask to electromagnetic radiation and the unexposed photoresist is removed using the developing process. The thickness of the photoresist layer can vary in various implementations. In a particular implementation, the thickness is about 20 microns.

Figure 4:
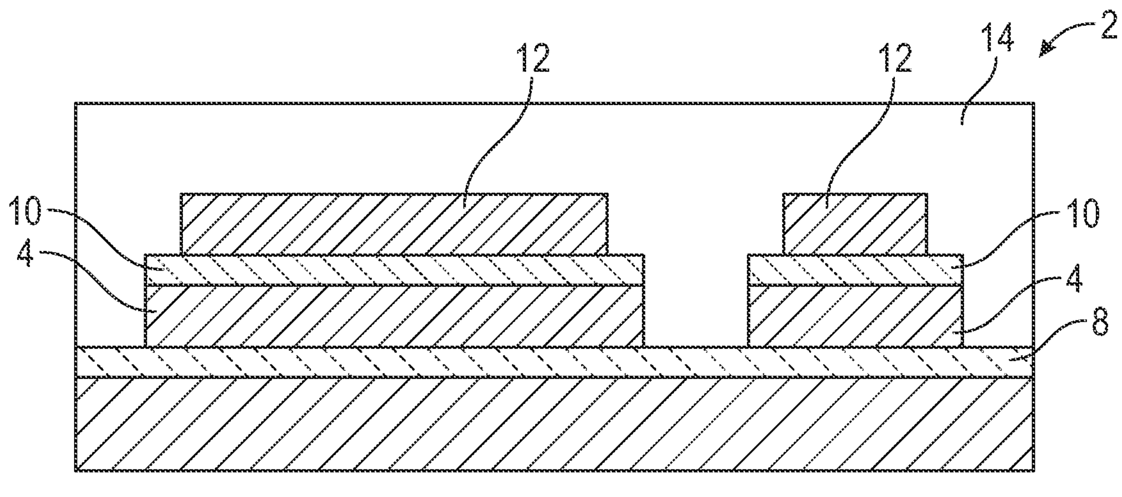
FIG. 4 is a side view of the semiconductor substrate of FIG. 3 following molding with a mold compound.

FIG. 4 illustrates the semiconductor substrate implementation 2 following application of a mold compound 14 over the photoresist layer 12, the over pad metallization layer 10, and the copper pads 4. As illustrated, the mold compound 14 contacts at least a sidewall of each of these layers. In various implementations, the mold compound may include 90% glass filler, but in others the mold compound may include any of a wide variety materials including, by non-limiting example, resins, epoxies, polymers, fillers, colorants, binders, or any other mold compound material type. In particular implementation, the mold compound may be 80 microns thick above the surface of the silicon dioxide layer 8 and may be cured at 150 C. The mold compound may be applied using any of a wide variety of molding processes including, by non-limiting example, transfer molding, injection molding, compression molding, or any other molding process.

Figure 5:
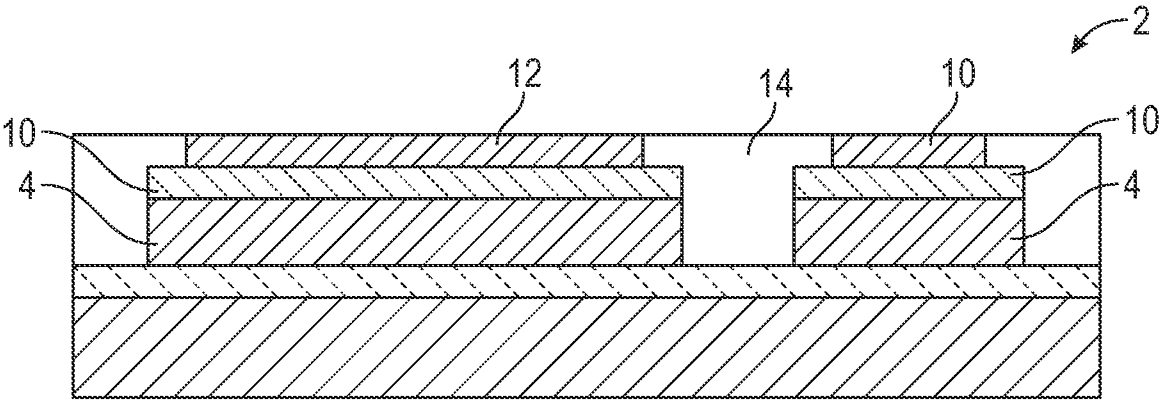
FIG. 5 is a side view of the semiconductor substrate of FIG. 4 following removal of a portion of the mold compound and a portion of the photoresist layer.
Figure 6:
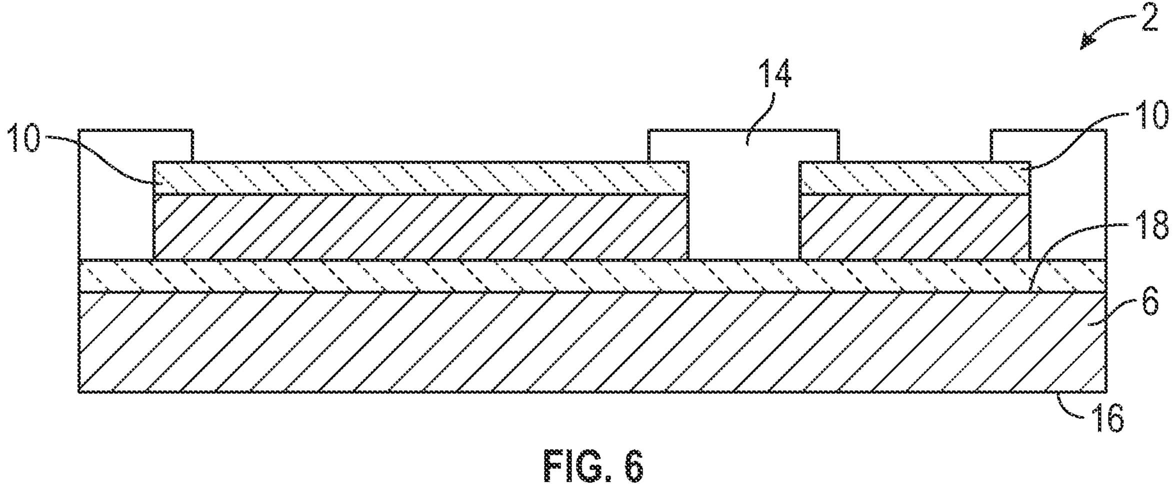
FIG. 6 is a side view of the semiconductor substrate of FIG. 5 following removal of the remaining portion of the photoresist layer.

Following the application of the mold compound 14, FIG. 5 illustrates the semiconductor substrate 2 following grinding of the mold compound down to a desired thickness above the copper pads 4 and the over pad metallization 10. As illustrated, during the grinding process, the material of the photoresist is also ground down and a portion removed to reach a desired thickness. In a particular implementation, the remaining thickness of the photoresist is about 10 microns. FIG. 6 illustrates the semiconductor substrate 2 following removal of the remaining portion of the photoresist layer 12. The removal may take place using a solvent or other chemical stripping process or using an ashing process in an ashing/etching tool in various method implementations. The particular method used to remove the photoresist may consider the possible interactions of the removal method with the material of the over pad metallization 10 to prevent damage/oxidation to the over pad metallization 10. The ability to use the photoresist layer 12 as a sacrificial layer during the grinding process may allow for bulk grinding processes to be used without causing any grinding damage to the over pad metallization 10. The semiconductor substrate 2 is now ready for additional processing steps to complete the package formation process for the various semiconductor die included in the substrate. These may include backgrinding processes applied to thin the semiconductor substrate 6 to about 25 microns or less in thickness.

In the foregoing method implementation, the grinding of the mold compound and the photoresist layer is described as taking place prior to backgrinding of the semiconductor substrate material itself. In other implementations, however, the backgrinding of the semiconductor substrate could take place directly after application of the mold compound. The grinding of the mold compound 14 and the photoresist layer 12 and the removal of the remaining portion of the photoresist layer could then take place immediately thereafter or after the formation of a back metal on the ground surface (second surface 16 opposing the first surface 18) of the semiconductor substrate 2.

Figure 7:
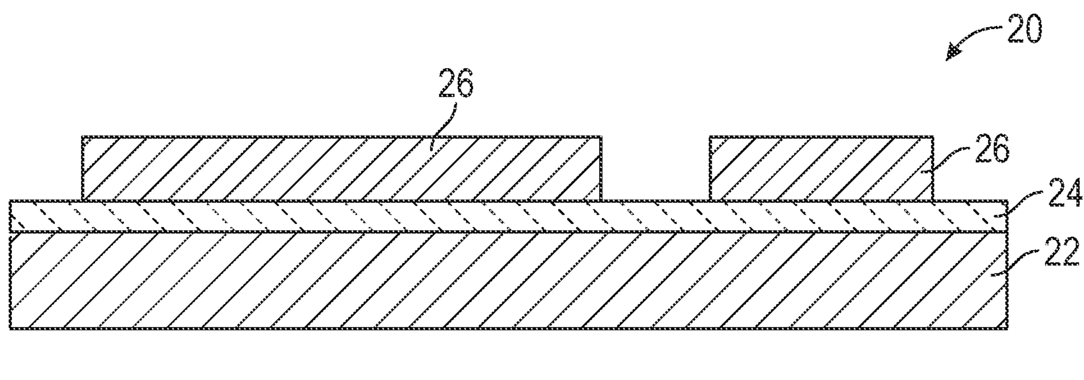
FIG. 7 is a side view of another implementation of a semiconductor substrate following formation of a plurality of copper pads thereon.
Figure 8:
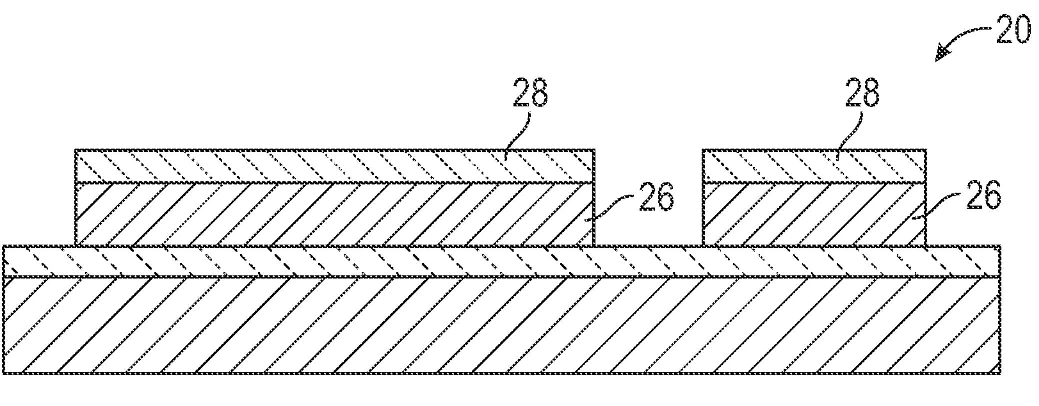
FIG. 8 is a side view of the semiconductor substrate of FIG. 7 following electroless plating of a layer of an over pad metallization.

Another implementation of a method of forming an over pad metallization structure utilizes a different sacrificial material. Referring to FIG. 7, an implementation of a semiconductor substrate 20 is illustrated that includes the substrate material 22, passivation layer 24, and copper pads/layer 26 that may be formed (including the use of UBM material not shown in FIG. 7) using any of the previously mentioned method processes. FIG. 8 illustrates the semiconductor substrate 20 following formation of over pad metallization layer 28 over the copper pads 26, which may take place using electroless plating and may involve any material type disclosed in this document for use as an over pad metallization layer.

Figure 9:
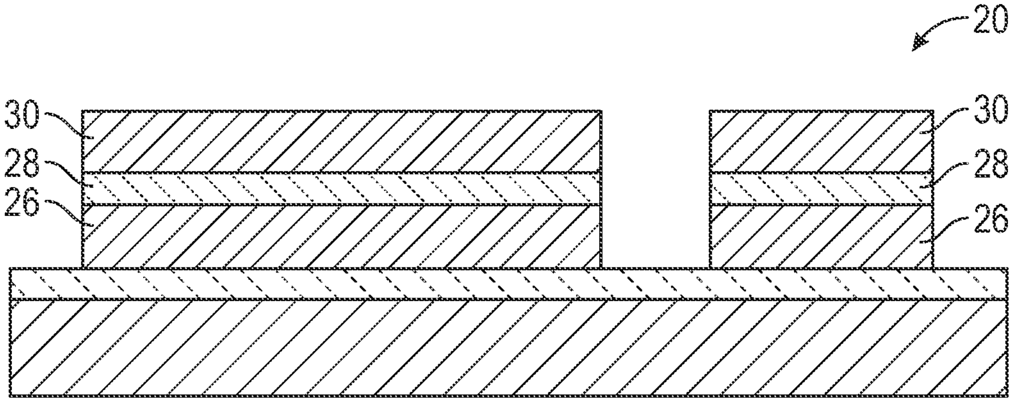
FIG. 9 is a side view of the semiconductor substrate of FIG. 8 following electroplating of a layer of copper onto the over pad metallization.
Figure 10:
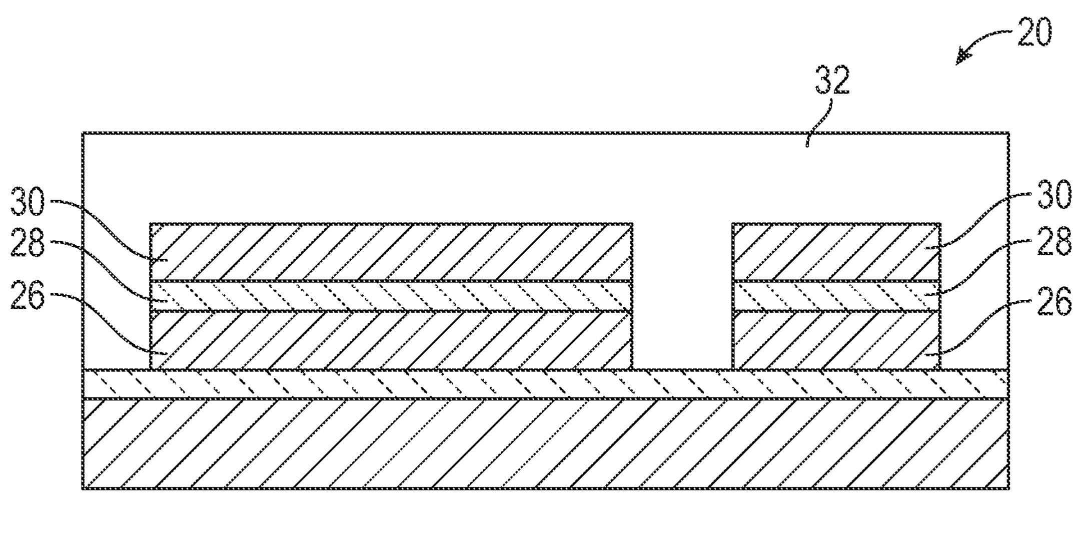
FIG. 10 is a side view of the semiconductor substrate of FIG. 9 following molding with a mold compound.

Referring to FIG. 9, the semiconductor substrate 20 is illustrated following electroplating of a layer of copper 30 onto the over pad metallization 28 and the copper pads 26. In various implementations, no additional patterning of the semiconductor substrate is used to facilitate/guide the electroplating of the layer of copper 30 because the copper pads 26 are already electrically isolated from each other. In various implementations, the thickness of the layer of copper 30 may be about 25 microns, similar to the thickness of the previously discussed photoresist layer. However, the layer of copper 30 may be thicker or thinner in various implementations. FIG. 10 illustrates the semiconductor substrate 20 and the layer of copper 30, the over pad metallization 28 and the copper pads 26 following application of mold compound 32 over them. The mold compound 32 may be any disclosed in this document and may be any thickness disclosed herein.

Figure 11:
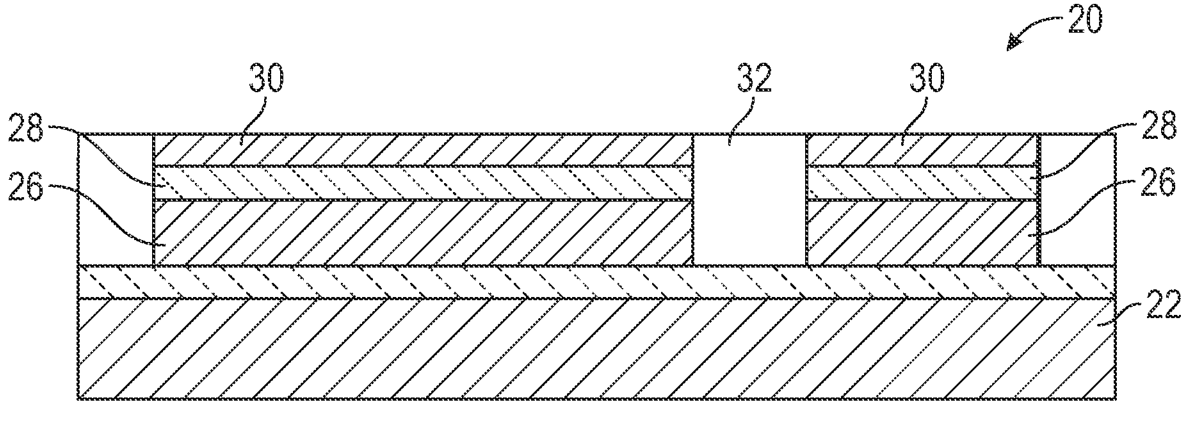
FIG. 11 is a side view of the semiconductor substrate of FIG. 10 following removal of a portion of the mold compound and a portion of the copper layer.
Figure 12:
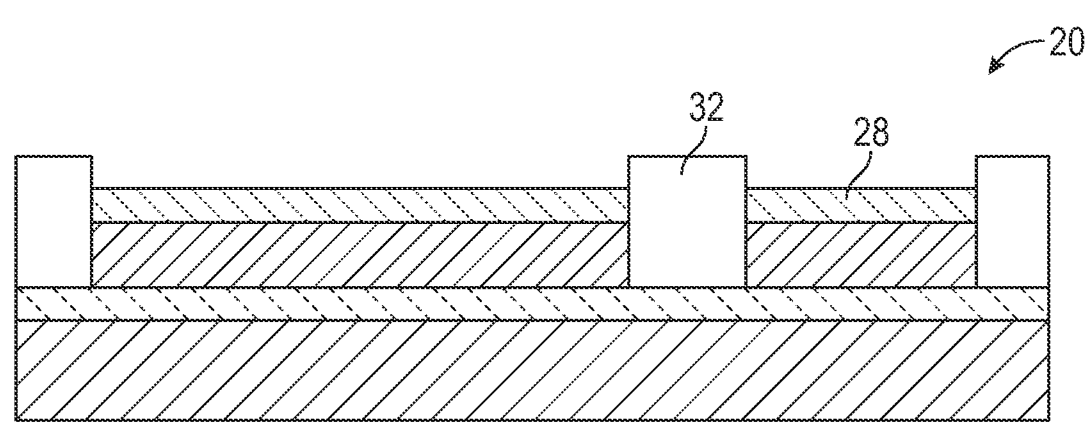
FIG. 12 is a side view of the semiconductor substrate of FIG. 11 following removal of the remaining portion of the copper layer.

Following application of the mold compound 32, FIG. 11 illustrates the semiconductor substrate 20 after grinding of the mold compound 32 and a portion of the copper layer 30 down to a desired thickness above the material of the substrate 22. In a particular implementation, the copper layer 30 may be ground down to a thickness of about 10 microns after the grinding process is complete. However, in various implementations the remaining thickness may be greater or less than this amount. FIG. 12 shows the semiconductor substrate 20 following removal of the remaining portion of the copper layer 30. In various implementations the copper layer 30 is removed via wet etching, leaving portions of the mold compound elevated above the surface of the over pad metallization 28, similar to the implementation illustrated in FIG. 6, but in this case, the mold compound does not cover any portion of the over pad metallization. While this structural difference in whether the position of the remaining mold compound is over the over pad metallization is illustrated between the semiconductor substrates 2, 20 illustrated in FIG. 6 and the one illustrated in FIG. 12, in various method implementations, the results could be reversed, where the photoresist extends across the entire width of each copper pad and a portion of the copper pad could be masked to prevent copper from depositing across the entire width of the copper pad. The semiconductor substrate 20 of FIG. 12 is now ready for further packaging operations, including backgrinding as previously discussed.

Figure 13:
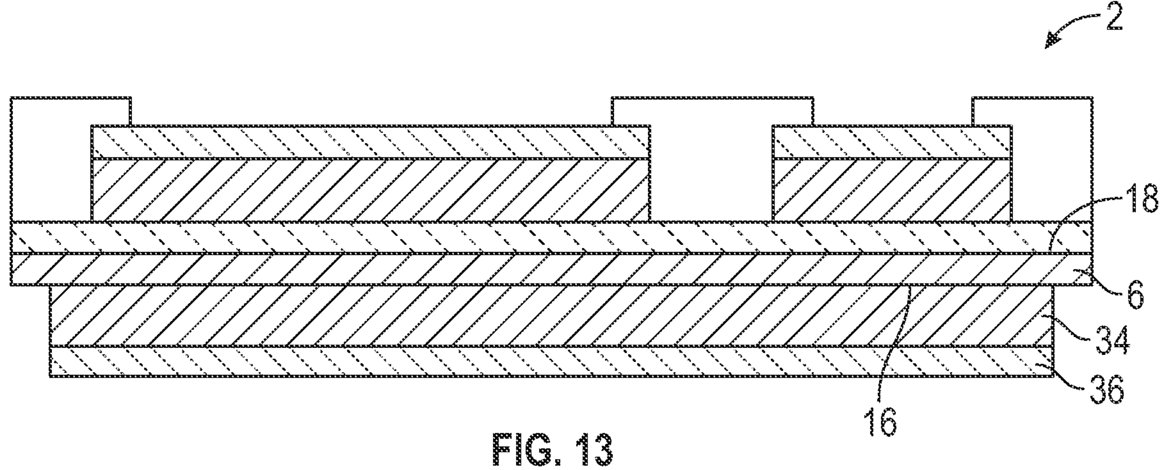
FIG. 13 is a side view of an implementation of a semiconductor substrate like that illustrated in FIG. 6 following backgrinding and formation of a back metal layer.

Referring to FIG. 13, an implementation of the semiconductor substrate 2 following further backside/second side processing is illustrated. In this implementation, the backgrinding of the silicon layer 6 has been completed. In particular implementations, the use of an edge ring grinding process may be employed where the interior of the silicon layer 6 is removed leaving a ring of full thickness material around the outside edge of the substrate that acts to support the thinned substrate until processing is completed and the edge ring is removed. In other implementations, the silicon layer may be thinned without the use of an edge ring, particularly if the grinding of the mold compound is not completed until after the backgrinding process is completed.

In various method implementations, following the backgrinding process, a stress relief etch of the back side 16 silicon layer 6 may be carried out followed by deposition of a copper seed layer on which a copper back metal layer 34 is electroplated. One or more additional layers 36 may then be applied. In the implementation illustrated, a layer of nickel, palladium, and gold has been electroless plated on the copper back metal layer. In various implementations, the thickness of the copper back metal layer 34 may be about 15 microns and the thickness of the nickel, palladium, and gold layer may be about 1.25 microns. The particular thickness of and materials chosen for the back metal layer may be chosen to affect/control the warpage of the semiconductor substrate 2 in view of the materials present on the front side 18 of the silicon layer 6.

Figure 14:
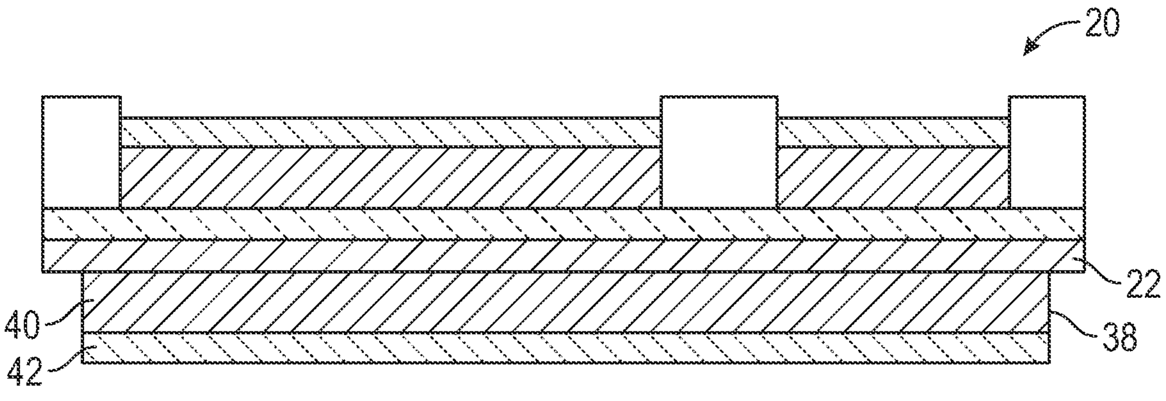
FIG. 14 is a side view of an implementation of a semiconductor substrate like that illustrated in FIG. 12 following backgrinding and formation of a back metal layer.

Referring to FIG. 14, an implementation of the semiconductor substrate 20 is illustrated following backgrinding and formation of back metal layer 38 on the ground surface of the silicon layer 22. Like the implementation illustrated in FIG. 13, the back metal layer 38 includes a copper layer 40 and one or more additional layers 42 which may be a layer of nickel, palladium, and gold as previously disclosed. For both the implementations of FIGS. 13 and 14, additional processing including die singulation and picking from singulating tape may be carried out to allow the individual semiconductor die to continue on through additional packaging operations, including, by non-limiting example, die attach, wire bonding, molding, marking, testing, or any other packaging operation. The resulting packages may be referred to as molded thin die packages.

While the use of further backgrinding operations has been disclosed in this document, in various method implementations, the semiconductor substrate may not be further background or thinned after the mold compound has been formed and ground on the front side of the substrate. In these implementations, the backgrinding may have been completed previous to the formation of the copper pads/layer or the semiconductor substrate may simply be processed at its full thickness. Those of ordinary skill in the art will appreciate how to form various method implementations using various combinations of the principles disclosed herein.

In places where the description above refers to particular implementations of molded thin die packages and implementing components, sub-components, methods and sub-methods, it should be readily apparent that a number of modifications may be made without departing from the spirit thereof and that these implementations, implementing components, sub-components, methods and sub-methods may be applied to other molded thin die packages.

What is claimed is:

1. A method of forming an over pad metallization structure, the method comprising:

providing a semiconductor substrate comprising a plurality of copper pads on a first side of the semiconductor substrate;

electroless plating an over pad metallization comprising nickel, palladium, and gold onto each copper pad of the plurality of copper pads;

patterning a layer of photoresist onto the over pad metallization of each copper pad of the plurality of copper pads;

forming a mold compound over the plurality of copper pads, the over pad metallization of each copper pad, and the layer of photoresist of each copper pad;

removing a portion of the mold compound and a portion of the layer of photoresist of each copper pad of the plurality of copper pads; and removing the layer of photoresist to expose the over pad metallization of each copper pad of the plurality of copper pads.

2. The method of claim 1, wherein removing the portion of the mold compound and the portion of the layer of photoresist further comprises backgrinding.

3. The method of claim 1, wherein the mold compound comprises 90% glass filler.

4. The method of claim 1, wherein the over pad metallization consists of nickel, palladium, and gold.

5. The method of claim 1, wherein patterning the layer of photoresist further comprises one of:

applying the photoresist, exposing the photoresist on the plurality of copper pads to electromagnetic radiation, and removing unexposed photoresist; or applying the photoresist, exposing the photoresist not on the plurality of copper pads to electromagnetic radiation, and removing exposed photoresist.

6. The method of claim 1, further comprising, after removing the layer of photoresist to expose the over pad metallization, thinning the semiconductor substrate to a thickness of 25 microns or less from a second side of the semiconductor substrate opposite the first side.

7. The method of claim 6, further comprising forming a back metal layer on the second side of the semiconductor substrate, the back metal layer comprising a layer of copper and a layer comprising nickel, palladium, and gold.

8. A method of forming an over pad metallization structure, the method comprising:

providing a semiconductor substrate comprising a plurality of copper pads on a first side of the semiconductor substrate;

electroless plating an over pad metallization comprising nickel, palladium, and gold onto each copper pad of the plurality of copper pads;

electroplating a layer of copper onto the over pad metallization of each copper pad of the plurality of copper pads;

forming a mold compound over the plurality of copper pads, the over pad metallization of each copper pad, and the layer of copper of each copper pad;

removing a portion of the mold compound and a portion of the layer of copper of each copper pad of the plurality of copper pads; and removing the layer of copper of each copper pad to expose the over pad metallization of each copper pad of the plurality of copper pads.

9. The method of claim 8, wherein removing the portion of the mold compound and the portion of the layer of copper further comprises backgrinding.

10. The method of claim 8, wherein the mold compound comprises 90% glass filler.

11. The method of claim 8, wherein the over pad metallization consists of nickel, palladium, and gold.

12. The method of claim 8, further comprising, after removing the layer of copper to expose the over pad metallization, thinning the semiconductor substrate to a thickness of 25 microns or less from a second side of the semiconductor substrate opposite the first side.

13. The method of claim 12, further comprising forming a back metal layer on the second side of the semiconductor substrate, the back metal layer comprising a layer of copper and a layer comprising nickel, palladium, and gold.

14. The method of claim 8, wherein removing the layer of copper further comprises removing by etching the layer of copper.

15. A method of forming an over pad metallization structure, the method comprising:

providing a semiconductor substrate comprising a plurality of copper pads on a first side of the semiconductor substrate;

electroless plating an over pad metallization onto each copper pad of the plurality of copper pads;

forming a mold compound over the plurality of copper pads and the over pad metallization of each copper pad;

only after electroless plating of the over pad metallization, removing a portion of the mold compound using grinding; and after the portion of the mold compound is removed, thinning the semiconductor substrate from a second side of the semiconductor substrate opposite the first side.

16. The method of claim 15, further comprising:

patterning a layer of photoresist onto the over pad metallization of each copper pad of the plurality of copper pads; and wherein removing a portion of the mold compound using grinding further comprises removing a portion of the layer of photoresist.

17. The method of claim 16, further comprising removing the layer of photoresist to expose the over pad metallization of each copper pad of the plurality of copper pads.

18. The method of claim 15, further comprising:

electroplating a layer of copper onto the over pad metallization of each copper pad of the plurality of copper pads; and wherein removing a portion of the mold compound using grinding further comprises removing a portion of the layer of copper.

19. The method of claim 18, further comprising removing the layer of copper to expose the over pad metallization of each copper pad of the plurality of copper pads.

20. The method of claim 19, wherein removing the layer of copper further comprises etching.

* * * * *